(12) United States Patent
Woelk et al.

(10) Patent No.: US 8,791,729 B2
(45) Date of Patent: Jul. 29, 2014

(54) MULTI-PHASE FREQUENCY DIVIDER HAVING ONE OR MORE DELAY LATCHES

(75) Inventors: Joachim Heinz Dieter Woelk, Besigheim (DE); Erwin Robert Schlag, Vaihingen/Enz (DE)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 13/493,400

(22) Filed: Jun. 11, 2012

(65) Prior Publication Data

US 2013/0328600 A1 Dec. 12, 2013

(51) Int. Cl.
*H03B 19/00* (2006.01)

(52) U.S. Cl.
USPC .............. 327/117; 327/115; 377/47

(58) Field of Classification Search
USPC .............. 327/115, 117; 377/47, 48
See application file for complete search history.

(56) References Cited

U.S. PATENT DOCUMENTS

| | | | |
|---|---|---|---|
| 4,541,109 A * | 9/1985 | Shimizu et al. | 381/15 |
| 4,993,051 A | 2/1991 | Feldbrugge | |
| 5,365,119 A * | 11/1994 | Kivari | 327/115 |
| 5,526,390 A | 6/1996 | Fucili | |
| 7,425,850 B2 * | 9/2008 | Widerin | 327/117 |
| 7,741,886 B2 * | 6/2010 | Tsai | 327/117 |
| 7,940,132 B2 * | 5/2011 | May et al. | 331/74 |
| 8,237,485 B2 * | 8/2012 | Meng et al. | 327/295 |
| 8,305,117 B2 * | 11/2012 | De Laurentiis et al. | 327/120 |
| 8,471,608 B2 * | 6/2013 | Velayuthan | 327/118 |
| 2006/0208776 A1 * | 9/2006 | Tonietto et al. | 327/117 |
| 2009/0167373 A1 | 7/2009 | Song | |
| 2012/0229179 A1 * | 9/2012 | Sano | 327/115 |

* cited by examiner

*Primary Examiner* — William Hernandez
(74) *Attorney, Agent, or Firm* — Edell, Shapiro & Finnan, LLC

(57) ABSTRACT

A multi-phase frequency divider comprises first and second latches configured to receive a first input clock having a first frequency and a first phase, wherein the second latch receives the inverted first input clock. The first and second latches generate a plurality of output clocks each having a frequency that equals the first frequency divided by a predetermined divider ratio. The plurality of output clocks each have different phases staggered from the first phase. The frequency divider also comprises at least a first delay latch electrically connected between the first and second latches. The first delay latch is configured to generate, based on an output clock generated by the first latch and a second input clock at the first frequency and a second phase, two delayed output clocks. These two delayed output clocks have a frequency that equals the first frequency divided by the predetermined ratio with different staggered phases.

24 Claims, 5 Drawing Sheets

MULTI-PHASE FREQUENCY DIVIDER HAVING ONE OR MORE DELAY LATCHES

TECHNICAL FIELD

The present disclosure relates generally to multi-phase frequency dividers.

BACKGROUND

Until recently, computers and other electronic devices primarily relied upon single-frequency, single-phase digital clocks. Generating and synthesizing such single-phase clocks, directly or with phase locked locked loops (PLLs) and dividers are straightforward.

New types of processors, power converters, and other electronic devices are increasingly making uses of multi-phase clocks. Multi-phase clocks are clocks having a plurality (2 or more) phases. Various mechanisms have been developed to generate multi-phase clocks, including different oscillators and frequency dividers.

For example, a multi-phase ring oscillator places an even-number of cross-coupling transistors and inverters end-to-end in a ring configuration. The output phases are tapped at the output of each inverter. Four of such inverters will produce a four-phase output.

Digital frequency dividers, sometimes referred to as clock dividers, are used in computer and communications circuits to synthesize clock signals from an input clock signal (input clock). More specifically, a frequency divider is a circuit that divides an input frequency (fin) of an input clock by an integer (n) to produce output clocks each having a different output frequency (fout). The integer is referred to herein as the divider ratio of the circuit, and the frequency of the output clocks is given below in Equation 1:

$$fout = \frac{fin}{n}. \quad \text{(Equation 1)}$$

DESCRIPTION OF EXAMPLE EMBODIMENTS

Overview

Figure 1:
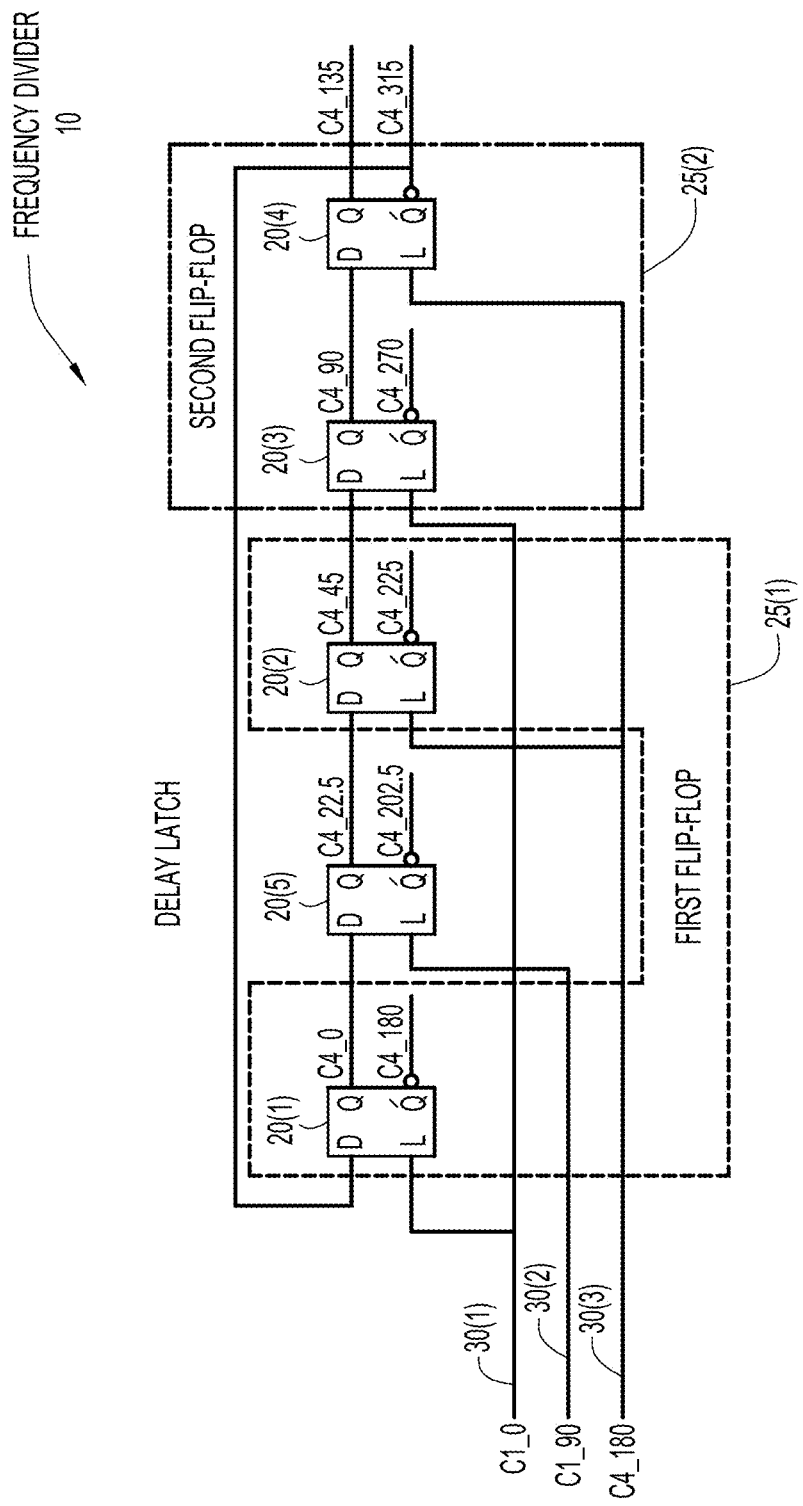
FIG. 1 is a circuit diagram of a frequency divider comprising two flip-flops and one delay latch.

A multi-phase frequency divider is provided that has one or more delay latches to increase the number of output phases generated by the frequency divider. One example frequency divider comprises first and second latches that are each configured to receive a first input clock having a first frequency and a first phase. The first and second latches collectively form a first flip-flop that generates a plurality of output clocks each having a frequency that equals the first frequency divided by a predetermined divider ratio. The plurality of output clocks generated by the first and second latches each have different phases staggered from the first phase. The frequency divider also comprises at least a first delay latch configured to generate, based on an output clock generated by one of the first or second latches and a second input clock at the first frequency and a second phase, two delayed output clocks. These two delayed output clocks have a frequency that equals the first frequency divided by the predetermined divider ratio and each have a different phase staggered from the first phase and from the phases of the output clocks generated by the first flip-flop.

In accordance with one example described herein, an apparatus comprises a plurality of at least three latches configured to form a chain Each latch comprises a clock input, a data input, a data output, and an inverting data output. The data output of each latch is electrically connected to the data input of the next latch in the chain and the inverting data output of the last latch in the chain is electrically connected to the data input of the first latch. Each latch receives an input clock having a first frequency and an individual input phase. The phase difference between the input clock of one latch with reference to the phase of the input clock of the next latch is larger than zero and does not exceed 180 degrees, and the phase difference between the input clock of the first latch with reference to the phase of the input clock of the last latch is larger than 180 degrees and less than 360 degrees.

In accordance with another example described herein, an apparatus comprises a plurality of at least five latches configured to form a chain. Each latch comprises a clock input, a data input, a data output, and an inverting data output. The data output of each latch is electrically connected to the data input of the next latch in the chain and the inverting data output of the last latch in the chain is electrically connected to the data input of the first latch. Each latch receives an input clock having a first frequency and an individual input phase. The phase difference between the input clock of one latch with reference to the phase of the input clock of the next latch is larger than zero and does not exceed 180 degrees, and the phase difference between the input clock of the first latch with reference to the phase of the input clock of the last latch is larger than 540 degrees and less than 720 degrees.

Example Embodiments

Frequency dividers may be formed from a number of different circuit elements. In certain arrangements, frequency dividers comprise flip-flops and one or more inverters having a back-coupled (i.e., feedback) structure. Specific implementations generally include the use of single flip-flop divider stages (so-called asynchronous dividers) or divider stages comprising two or more flip-flops connected to form a circular shift register (also called ring counter). If a ring counter does not incorporate an inverter, the output of the last flip-flop is connected to the input of the first flip-flop. This specific structure is known as the straight ring counter or Overbeck counter; otherwise it is called a twisted ring, Johnson, or Möbius (Moebius) counter. An Overbeck counter made of n flip-flops has a divider ratio of n and is initialized into a state where at least one flip-flop has a polarity different than that of the other flip-flops. Such an Overbeck counter needs to be supervised by some type of control logic (i.e., arrangements of different logic gates) to ensure that the counter is always in one of the n correct states. If the Overbeck counter is not in one of these states, the divider ratio will be incorrect.

Johnson counters made of n flip-flops have a divider ration of 2 n and the resulting clocks at each flip-flop output have a duty cycle of approximately 50%. Due to the demands for output clocks having a large number of different phases, it is common for Johnson counters to include multiple flip-flops. Such Johnson counters suffer from the same problem as Overbeck counters in that the use of a plurality of flip-flops introduces the possibility of illegal counter states that result in incorrect divider ratios. As such, Johnson counters require initialization and supervision logic (i.e., arrangements of different logic gates) to ensure that the counter is always in one of the n correct states. In other words, a Johnson counter needs to be initialized and supervised to always be in one of the 2 n correct states out of $2^n$ physically existing states, otherwise the divider ratio will be incorrect. The additional of this logic increases gate count and power consumption, while also decreasing speed.

It has been discovered that the need for initialization and supervision logic in frequency dividers may be eliminated by using frequency dividers in a Johnson counter configuration that does not have any illegal states. More specifically, it has been discovered that Johnson counter frequency dividers limited in size to a maximum of two flip-flops (i.e., one or two flip-flops) cannot experience an illegal state that results in an incorrect divider ratio. A Johnson counter frequency divider that includes one flip-flop will result in a divider ratio equal to two, two physical states, and no (zero) illegal states. Additionally, a Johnson counter frequency divider that includes two flip-flops will result in a divider ratio that is equal to four, four physical states, and zero illegal states.

Therefore, presented herein is a multi-phase frequency divider having a Johnson counter configuration that produces a plurality of clocks having staggered output phases without the need for additional initialization/supervision logic. More specifically, the proposed frequency divider functionally comprises a maximum of two flip-flops (i.e., 1 or 2 flip-flops only) to generate a plurality of output clocks. Because such a frequency divider will not have illegal states, there is no need for initiation or supervision logic. As detailed further below, the number of output clock phases generated by the frequency divider is increased by adding one or more delay latches to the frequency divider and ensuring that, despite the addition of the one or more delay latches, the frequency divider still functionally operates as a circuit including two or less flip-flops. A frequency divider described herein functionally operates as a one flip-flop circuit when it includes only two states (high and low) and consequently divides the clock by 2, while a frequency divider described herein functionally operates as a two flip-flop circuit when it includes only four total states (two high states and two low states) and consequently divides the clock by 4.

FIG. 1 is a circuit diagram of a frequency divider 10 in accordance with an example described herein. Frequency divider circuit 10 comprises five latches 20(1)-20(5). In this example, latches 20(1)-20(5) are each data (D)-type latches. Frequency divider 10 is configured to functionally operate as a Johnson counter having two D-type flip-flops.

In the example of FIG. 1 the first latch 20(1) and the second latch 20(2) collectively functionally form a first flip-flop 25(1). Additionally, the third latch 20(3) and the fourth latch 20(4) functionally form a second flip-flop 25(2). First, second, third, and fourth latches 20(1)-20(4) are sometimes referred to herein as frequency divider latches because they collectively operate to provide the frequency division at the divider ratio. Also shown is a delay latch 20(5) which will be described in further detail below. Although the frequency divider 10 includes a total of 5 latches, the frequency divider 10 is considered to functionally include only two flip-flops 25(1) and 25(2) because the divider circuit only has a total of four states; a high and low state corresponding to each of the group of latches forming flip-flops 25(1) and 25(2).

Frequency divider 10 includes three input clock signals (input clocks) 30(1), 30(2), and 30(3). For ease of illustration, clock inputs and outputs are illustrated herein using a $C_{x\_y}$ format, where the subscript "x" represents a ratio (divider ratio) at which the frequency of the clock signal has been divided from an original (baseline) input clock signal, and the subscript "y" represents the phase (in degrees) of the signal with reference to the phase of the baseline input clock signal ratio "x." Input clock 30(1) is represented as $C_{1\_0}$, meaning that the input clock is the baseline input signal that has not been frequency divided or phased shifted. Input clock 30(3) is represented as $C_{1\_180}$, meaning that the frequency of this input clock has not been divided, but the input clock is staggered in phase (phase shifted) from the baseline input clock (30(1)) by approximately 180 degrees. A phase shift of 180 degrees means that the input clock 30(3) is the "inverse" of the input clock 30(1). Input clock 30(2) is represented as $C_{1\_90}$, meaning that the frequency of this input clock has not been divided, but the input clock is staggered in phase (phase shifted) from the baseline input clock (30(1)) by approximately 90 degrees.

As noted above, each latch 20(1)-20(5) is a D latch and has a data input (represented by "D"), an enable input (represented by "L"), a first output (represented by "Q"), and a second output (represented by "Q'"). The second output Q' is the inverse or complement of the first output Q.

Latches 20(1)-20(5) are serially connected in the following order: first latch 20(1), delay latch 20(5), second latch 20(2), third latch 20(3), and fourth latch 20(4). The first latch 20(1) receives the first input clock 30(1) at its L input, and receives the Q' output (i.e., the inverted output) from fourth latch 20(4) at its D input. That is, the inherently available inverted output of the second flip-flop 25(2) is used to provide the inverting feedback into the D input of the first flip-flop 25(1). Because the Q' output of latch 20(4) is back-coupled to the D input of the first latch 20(1), frequency divider 10 has a Johnson counter configuration.

The first latch 20(1) generates two output clocks, one at the Q output and one at the Q' output. The clock output at Q is represented by $C_{4\_0}$, meaning that the frequency of this signal is ¼ of the frequency of the input clock 30(1) (i.e., the frequency has been divided by a factor of 4), but has the same phase as the input clock 30(1). The output clock at Q' is represented by $C_{4\_180}$, meaning that the frequency of this signal is ¼ of the frequency of the input clock 30(1) and has a phase that is shifted from the phase of the output clock at Q of the first latch 20(1) by 180 degrees. That is, because the output clock at Q has a phase shift of zero (with respect to input clock 30(1)), the output clock at Q' has a phase shift, with respect to the phase of input clock 30(1), of 180 degrees.

The D input of the delay latch 20(5) is connected to the Q output of the first latch 20(1) (i.e., delay latch 20(5) is the second latch in the series). Delay latch 20(5) receives, at its L input, the second clock signal 30(2). The delay latch 20(5) generates two output clocks, one at the Q output and one at the Q' output. The clock output at Q is represented by $C_{4\_225}$, meaning that the frequency of this signal is ¼ of the frequency of the input clock 30(1) and has a phase that is shifted from the phase of the input clock 30(1) by 22.5 degrees. The output clock at Q' is represented by $C_{4\_202.5}$, meaning that the frequency of this signal is ¼ of the frequency of input clock 30(1) and has a phase that is shifted from the phase of the output clock at Q of the delay latch 20(5) by 180 degrees. That is, because the output clock at Q has a phase shift of 22.5 degrees (with respect to input clock 30(1)), the output clock at Q' has a phase shift, with respect to the phase of input clock 30(1), of 202.5 degrees.

The performance of a circuit including latches and flip-flops may suffer from setup times, hold times, propagation delays and phase uncertainty of the used input clocks. The clock speed of the circuitry is chosen to be small enough so that the sum of hold time, propagation delay, setup time and input clock phase uncertainties is not larger than the clock period (in case of flip-flops) or 0.5 clock period (in case of latches). In the example of FIG. 1, the input clock rate is chosen such that additional delay(s) (via delay latch 20(5)) may be inserted between flip-flops, or between latches, as long as the sum of the setup/hold times, delays, and uncertainties is small enough to not violate the timing requirement. For example, when the input clock rate is chosen to be $f_1=32$ GHz (corresponding to a clock period of $t_1=1/f_1=31.25$ ps), then the sum of hold time, propagation delay, setup time, and input clock phase uncertainties may not exceed $t_1/2$ (e.g., 15.625 ps) when no delay latch is present between two latches. If one delay latch is present between the latches of a flip-flop, and the delay latch receives an input clock with a phase of approximately 90 degrees delayed with reference to the first phase, then the sum of hold time, propagation delay, setup time, and input clock phase inaccuracies may not exceed $t_1/4$ (e.g., 7.81 ps). More generally, if the phase difference between two succeeding latches is p degrees, then the sum of hold time, propagation delay, setup time and input clock phase inaccuracies may not exceed $t_1*p/360$. As noted above, although frequency divider 10 includes five latches, the circuit logically is still a two flip-flop Johnson counter as long as the setup and hold time requirements are met.

The D input of the second latch 20(2) is connected to the Q output of the delay latch 20(5) (i.e., second latch 20(2) is the third latch in the series). Second latch 20(2) receives, at its L input, the third clock signal 30(3). The second latch 20(2) generates two output clocks, one at the Q output and one at the Q' output. The clock output at Q is represented by $C_{4\_45}$, meaning that the frequency of this signal is ¼ of the frequency of the input clock 30(1) and has a phase that is shifted from the phase of the input clock 30(1) by 45 degrees. The output clock at Q' is represented by $C_{4\_225}$, meaning that the frequency of this signal is ¼ of the frequency of the input clock 30(1) and has a phase that is shifted from the phase of the output clock at Q of the second latch 20(2) by 180 degrees. That is, because the output clock at Q has a phase shift of 45 degrees (with respect to input clock 30(1)), the output clock at Q' has a phase shift, with respect to the phase of input clock 30(1), of 225 degrees.

The D input of the third latch 20(3) is connected to the Q output of the second latch 20(2) (i.e., third latch 20(3) is the fourth latch in the series). Third latch 20(3) receives, at its L input, the first clock signal 30(1). The third latch 20(3) generates two output clocks, one at the Q output and one at the Q' output. The clock output at Q is represented by $C_{4\_90}$, meaning that the frequency of this signal is ¼ of the frequency of the input clock 30(1) and has a phase that is shifted from the phase of the input clock 30(1) by 90 degrees. The output clock at Q' is represented by $C_{4\_270}$, meaning that the frequency of this signal is ¼ of the frequency of the input clock 30(1) and has a phase that is shifted from the phase of the output clock at Q of the third latch 20(3) by 180 degrees. That is, because the output clock at Q has a phase shift of 90 degrees (with respect to input clock 30(1)), the output clock at Q' has a phase shift, with respect to the phase of input clock 30(1), of 270 degrees.

The D input of the fourth latch 20(4) is connected to the Q output of the third latch 20(3) (i.e., fourth latch 20(4) is the fifth latch in the series). Fourth latch 20(4) receives, at its L input, the third clock signal 30(3). The fourth latch 20(4) generates two output clocks, one at the Q output and one at the Q' output. The clock output at Q is represented by $C_{4\_135}$, meaning that the frequency of this signal is ¼ of the frequency of the input clock 30(1) and has a phase that is shifted from the phase of the input clock 30(1) by 135 degrees. The output clock at Q' is represented by $C_{4\_315}$, meaning that the frequency of this signal is ¼ of the frequency of the input clock 30(1) and has a phase that is shifted from the phase of the output clock at Q of the fourth latch 20(4) by 180 degrees. That is, because the output clock at Q has a phase shift of 135 degrees (with respect to input clock 30(1)), the output clock at Q' has a phase shift, with respect to the phase of input clock 30(1), of 315 degrees. As noted above, the Q' output of the fourth latch 20(4) is connected to the D input of the first latch 20(1).

The frequency divider 10 of FIG. 1 is referred to herein as a 4:1 frequency divider because it divides the frequency of the base input clock 30(1) by a factor of four (i.e., the circuit has a divider ratio of 4). However, this frequency divider 10 is also a multi-phase frequency divider because it generates ten (10) different signals having the divided frequency, but each having different staggered phases. The phases are staggered in that they each have a phase shift from the phase of the base input clock 30(1) by progressively different amounts from the phase of the base input clock. In certain examples, the phases are staggered such that they are evenly spaced from another, starting at the phase of the base input clock 30(1). In other words, the first latch in the series generates a signal with no phase shift, but each sequential latch generates a clock signal at its Q output that is shifted by the same amount from the clock signal received at its input. Table 1, below, provides an illustration of the various inputs and outputs of each latch in the example of FIG. 1. For ease of reference, the latches are listed in Table 1 in the same sequence in which they are arranged serially in the frequency divider.

| Latch | D Input | L Input | Q Output | Q' Output |
| --- | --- | --- | --- | --- |
| First Latch 20(1) | $C_{4\_315}$ | $C_{1\_0}$ | $C_{4\_0}$ | $C_{4\_180}$ |
| Delay Latch 20(5) | $C_{4\_0}$ | $C_{1\_90}$ | $C_{4\_22.5}$ | $C_{4\_202.5}$ |
| Second Latch 20(2) | $C_{4\_22.5}$ | $C_{1\_180}$ | $C_{4\_45}$ | $C_{4\_225}$ |
| Third Latch 20(3) | $C_{4\_45}$ | $C_{1\_0}$ | $C_{4\_90}$ | $C_{4\_270}$ |
| Fourth Latch 20(4) | $C_{4\_90}$ | $C_{1\_180}$ | $C_{4\_135}$ | $C_{4\_315}$ |

FIG. 1 illustrates a specific example in which a 4:1 frequency divider circuit comprises five latches, but functionally operates as a two flip-flop circuit. In general, example 4:1 frequency divider circuits described herein comprise at least five latches configured to form a chain (i.e., the at least five latches are serially connected to one another). Each latch comprises a clock input, a data input, a data output, and an inverting data output. The data output of each latch is electrically connected to the data input of the next latch in the chain and the inverting data output of the last latch in the chain is electrically connected to the data input of the first latch. Each latch receives an input clock having a first frequency and an individual input phase. The phase difference between the input clock of one latch with reference to the phase of the input clock of the next latch is larger than zero and does not exceed 180 degrees, and the phase difference between the input clock of the first latch with reference to the phase of the input clock of the last latch is larger than 540 degrees and less than 720 degrees.

Figure 2:
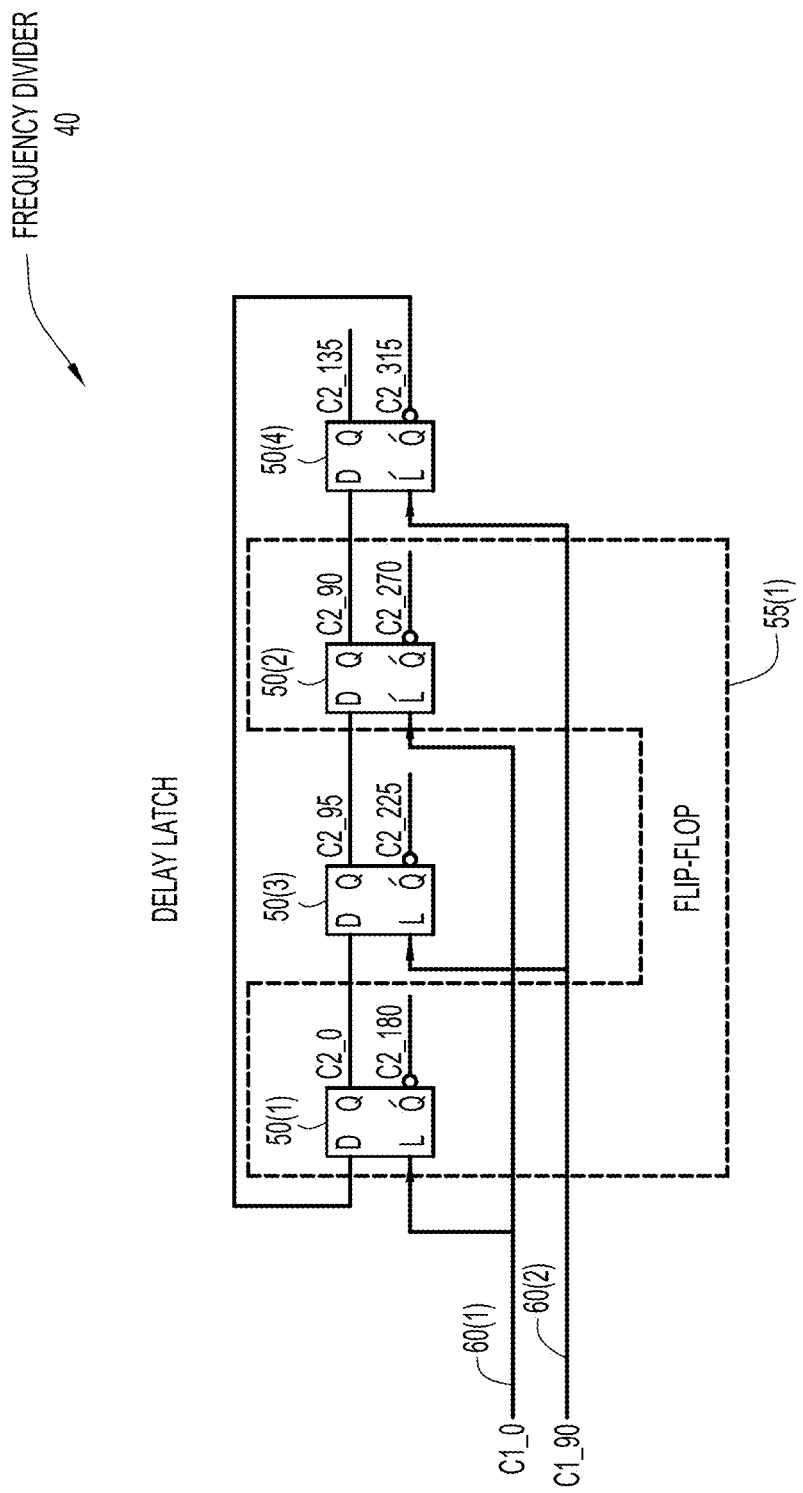
FIG. 2 is a circuit diagram of a frequency divider comprising a single flip-flop circuit and two delay latches.

FIG. 2 is a circuit diagram of a frequency divider 40 in accordance with another example. Frequency divider circuit 40 comprises four latches 50(1)-50(4). In this example, latches 50(1)-50(4) are each D-type latches. Frequency divider 40 is configured to functionally operate as a Johnson counter having one D-type flip-flop.

In the example of FIG. 2, the first latch 50(1) and the second latch 50(2) collectively functionally form a flip-flop 55(1). The first and second latches are sometimes referred to herein as frequency divider latches because they collectively operate to provide the frequency division at the divider ratio. Also shown are two delay latches 50(3) and 50(4) which will be described in further detail below. Although the frequency divider 40 includes a total of 4 latches, the frequency divider 40 is considered to functionally include only one flip-flop 55(1) because the divider circuit only has a total of two states, one high and one low state corresponding to the latches 50(1) and 50(2) forming the flip-flop 55(1), resulting in a clock division ratio of 2:1.

Frequency divider 40 includes two input clock signals (input clocks) 60(1) and 60(2). Input clock 60(1) is represented as $C_{1\_0}$, meaning that the input clock is the baseline input signal that has not been frequency divided or phased shifted. Input clock signal 60(2) is represented as $C_{1\_90}$, meaning that the frequency of this input clock has not been divided, but the input clock is staggered in phase (phase shifted) from the baseline input signal (60(1)) by approximately 90 degrees.

Latches 50(1)-50(4) are serially connected in the following order: first latch 50(1), first delay latch 50(3), second latch 50(2), and second delay latch 50(4). More specifically, the first latch 50(1) receives the first input clock 60(1) at its L input, and receives the Q' output (i.e., the inverted output) from the second delay latch 50(4) at its D input. That is, the inherently available inverted output is used to provide the inverting feedback into the D input of the flip-flop 55(1). Because the Q' output of second delay latch 50(4) is fed back to the D input of the first latch 50(1), frequency divider 40 has a Johnson counter configuration.

The first latch 50(1) generates two output clocks, one at the Q output and one at the Q' output. The clock output at Q is represented by $C_{2\_0}$, meaning that the frequency of this signal is ½ of the frequency of the input clock 60(1) (i.e., the frequency has been divided by a factor of 2), but has the same phase as the input clock 60(1). The output clock at Q' is represented by $C_{2\_180}$, meaning that the frequency of this signal is ½ of the frequency of the input clock 60(1) and has a phase that is shifted from the phase of the output clock at Q of the first latch 50(1) by 180 degrees. That is, because the output clock at Q has a phase shift of zero (with respect to input clock 60(1)), the output clock at Q' has a phase shift, with respect to the phase of input clock 60(1), of 180 degrees.

The D input of the first delay latch 50(3) is connected to the Q output of the first latch 50(1) (i.e., delay latch 50(3) is the second latch in the series). Delay latch 50(3) receives, at its L input, the second clock signal 60(2). The delay latch 50(3) generates two output clocks, one at the Q output and one at the Q' output. The clock output at Q is represented by $C_{2\_45}$, meaning that the frequency of this signal is ½ of the frequency of the input clock 60(1) and has a phase that is shifted from the phase of the input clock 60(1) by 45 degrees. The output clock at Q' is represented by $C_{2\_225}$, meaning that the frequency of this signal is ½ of the frequency of the input clock 60(1) and has a phase that is shifted from the phase of the output clock at Q of the delay latch 50(3) by 180 degrees. That is, because the output clock at Q has a phase shift of 45 degrees (with respect to input clock 60(1)), the output clock at Q' has a phase shift, with respect to the phase of input clock 60(1), of 225 degrees.

In the example of FIG. 2, the input clock rate has been chosen such that additional delay(s) (via delay latches 50(3) and 50(4)) may be inserted between latches, as long as the sum of delay/hold times, propagation delays, and uncertainties is small enough to not violate the timing requirement. In general, as described above, if the phase difference between two succeeding latches is p degrees, then the sum of hold time, propagation delay, setup time and input clock phase inaccuracies may not exceed $t_1*p/360$. As noted above, although frequency divider 40 includes four latches, the circuit logically is still a one flip-flop Johnson counter, as long as the setup and hold time requirements are met.

The D input of the second latch 50(2) is connected to the Q output of the first delay latch 50(3) (i.e., second latch 50(2) is the third latch in the series). Second latch 50(2) receives, at its L input, the first clock signal 60(1). However, as shown in FIG. 2, the L input of this second latch 50(2) includes an inverter such that the signal fed into the logic of the latch will be, in fact, the inverse of first clock signal 60(1) (i.e., $C_{1\_180}$). Accordingly, the L input for this latch is referred to as L'.

The second latch 50(2) generates two output clocks, one at the Q output and one at the Q' output. The clock output at Q is represented by $C_{2\_90}$, meaning that the frequency of this signal is ½ of the frequency of the input clock 60(1) and has a phase that is shifted from the phase of the input clock 60(1) by 90 degrees. The output clock at Q' is represented by $C_{2\_270}$, meaning that the frequency of this signal is ½ of the frequency of the input clock 60(1) and has a phase that is shifted from the phase of the output clock at Q of the second latch 50(2) by 180 degrees. That is, because the output clock at Q has a phase shift of 90 degrees (with respect to input clock 60(1)), the output clock at Q' has a phase shift, with respect to the phase of input clock 60(1), of 270 degrees.

The D input of the second delay latch 50(4) is connected to the Q output of the second latch 50(2) (i.e., second delay latch 50(4) is the fourth latch in the series). Second delay latch 50(4) receives, at its L input, the second clock signal 60(2). However, as shown in FIG. 2, the L input of this second delay latch 50(4) includes an inverter such that the signal fed into the logic of the latch will be, in fact, the inverse of second clock signal 60(2) (i.e., $C_{1\_270}$). Accordingly, the L input for this latch is referred to as L'.

The second delay latch 50(4) generates two output clocks, one at the Q output and one at the Q' output. The clock output at Q is represented by $C_{2\_135}$, meaning that the frequency of this signal is ½ of the frequency of the input clock 60(1) and has a phase that is shifted from the phase of the input clock 60(1) by 135 degrees. The output clock at Q' is represented by $C_{2\_135}$, meaning that the frequency of this signal is ½ of the frequency of the input clock 60(1) and has a phase that is shifted from the phase of the output clock at Q of the second delay latch 50(4) by 180 degrees. That is, because the output clock at Q has a phase shift of 135 degrees (with respect to input clock 60(1)), the output clock at Q' has a phase shift, with respect to the phase of input clock 60(1), of 315 degrees.

The frequency divider 40 of FIG. 2 is referred to herein as a 2:1 frequency divider because it divides the frequency of the base input clock 60(1) by a factor of two (i.e., the circuit has a divider ratio of 2). However, this frequency divider 40 is also a multi-phase frequency divider because it generates eight (8) different signals having the divided frequency, but each having different staggered phases. The phases are staggered in that they each have a phase shift from the phase of the base input clock 60(1). Table 2, below, provides an illustration of the various inputs and outputs of each latch in the example of FIG. 2. For ease of reference, the latches are listed in Table 2 in the same sequence in which they are arranged serially in the frequency divider.

| Latch | D Input | L Input | Q Output | Q' Output |
|---|---|---|---|---|
| First Latch 50(1) | $C_{2\_315}$ | $C_{1\_0}$ | $C_{2\_0}$ | $C_{2\_180}$ |
| Delay Latch 50(3) | $C_{2\_0}$ | $C_{1\_90}$ | $C_{2\_45}$ | $C_{2\_225}$ |
| Second Latch 50(2) | $C_{2\_45}$ | $C_{1\_180}$ | $C_{2\_90}$ | $C_{2\_270}$ |
| Delay Latch 50(4) | $C_{2\_90}$ | $C_{1\_270}$ | $C_{2\_135}$ | $C_{2\_315}$ |

FIG. 2 illustrates a specific example in which a 2:1 frequency divider circuit comprises four latches, but functionally operates as a one flip-flop circuit. In general, example 2:1 frequency divider circuits described herein comprise at least three latches configured to form a chain (i.e., the at least three latches are serially connected to one another). Each latch in the chain comprises a clock input, a data input, a data output, and an inverting data output. The data output of each latch is electrically connected to the data input of the next latch in the chain and the inverting data output of the last latch in the chain is electrically connected to the data input of the first latch. Each latch is configured to receive an input clock having a first frequency and an individual input phase. The phase difference between the input clock of one latch with reference to the phase of the input clock of the next latch is larger than zero and does not exceed 180 degrees, and the phase difference between the input clock of the first latch with reference to the phase of the input clock of the last latch is larger than 180 degrees and less than 360 degrees.

Figure 3:
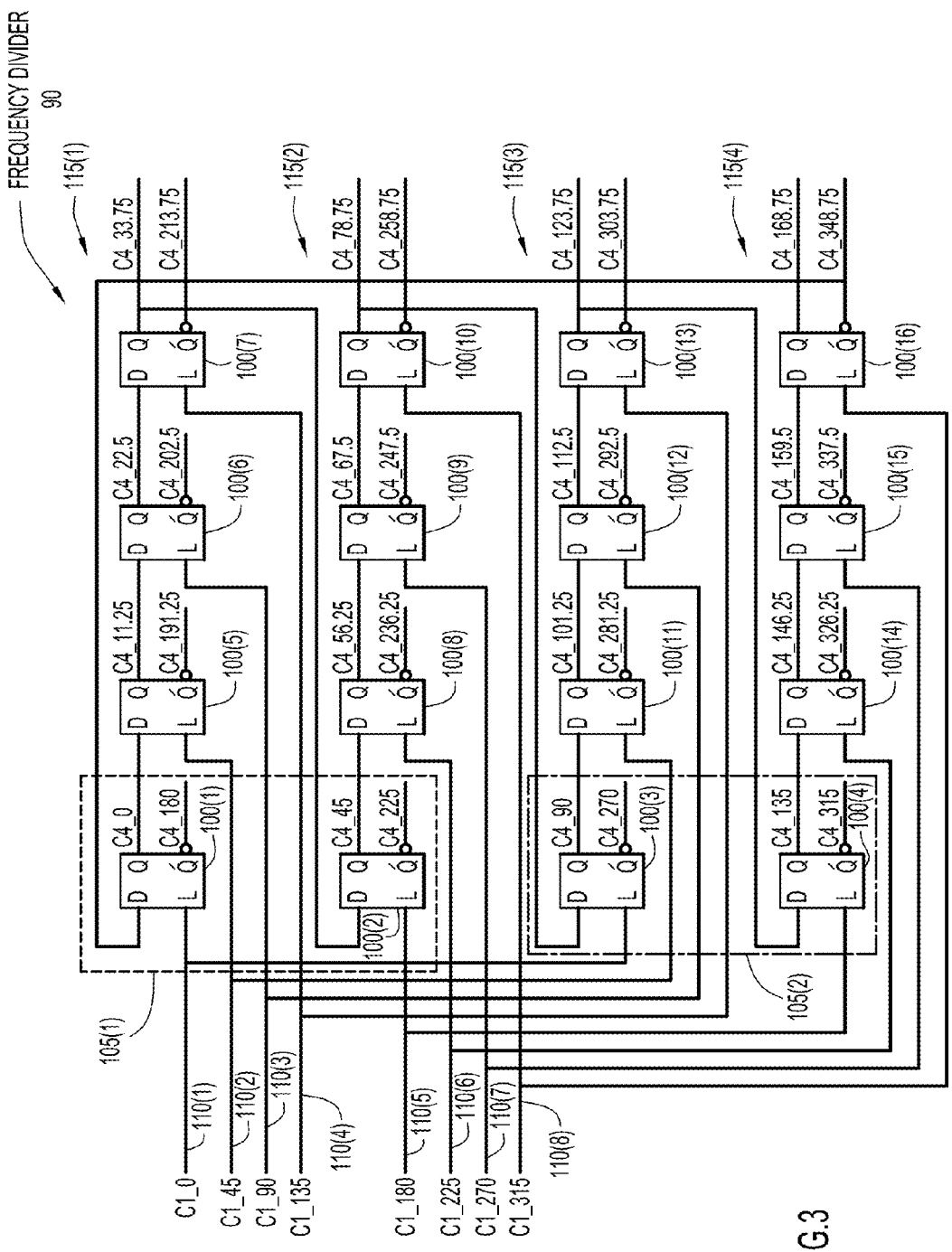
FIG. 3 is a circuit diagram of a frequency divider according to another configuration that includes two flip-flops and a plurality of delay latches.

FIG. 3 is a circuit diagram of a frequency divider 90 in accordance with examples described herein. In this example, the frequency divider 90 comprises a total of sixteen (16) latches 100(1)-100(16). In this example, latches 100(1)-100(16) are each D-type latches. Frequency divider 90 is configured to functionally operate as a Johnson counter having two D-type flip-flops.

In the example of FIG. 3 the first latch 100(1) and the second latch 100(2) collectively functionally form a first flip-flop 105(1). Additionally, the third latch 100(3) and the fourth latch 100(4) functionally form a second flip-flop 105(2). First, second, third, and fourth latches 100(1), 100(2), 100(3), and 100(4) are sometimes referred to herein as frequency divider latches because they collectively operate to provide the frequency division at the divider ratio. Also shown are a plurality of delay latches 100(5)-100(16) which will be described in further detail below. Although the frequency divider 90 includes a total of 16 latches, the frequency divider 90 is considered to functionally include only two flip-flops 105(1) and 105(2) because the divider circuit only has a total of four states; a high and low state corresponding to each of the group of latches forming flip-flops 105(1) and 105(2), resulting in a clock division ratio of 4:1.

In this example, frequency divider 90 receives a total of eight (8) input clock signals (input clocks) 110(1)-110(8) having the same frequency, but different phases. In this example, input clock 110(5) is the inverse of input clock 110(1), input clock 110(6) is the inverse of input clock 110(2), input clock 110(7) is the inverse of input clock 110(3), and input clock 110(8) is the inverse of input clock 110(4).

Latches 100(1)-100(16) are serially connected in the following order: first latch 100(1), delay latch 100(5), delay latch 100(6), delay latch 100(7), second latch 100(2), delay latch 100(8), delay latch 100(9), delay latch 100(10), third latch 100(3), delay latch 100(11), delay latch 100(12), delay latch 100(13), fourth latch 100(4), delay latch 100(14), delay latch 100(15), and delay latch 100(16). Therefore, in this example there is a first group 115(1) of delay latches (i.e., delay latches 100(5)-100(7)) connected between the first latch 100(1) and the second latch 100(2), and a second group 115(2) of delay latches (i.e., delay latches 100(8)-100(10)) connected between the second latch 100(2) and the third latch 100(3). There is also a third group 115(3) of delay latches (i.e., delay latches 100(11)-100(13)) connected between the third latch 100(3) and the fourth latch 100(4), and a fourth group 115(4) of delay latches (i.e., delay latches 100(14)-100(16)) connected after the fourth latch 100(4).

As described above with reference to FIGS. 1 and 2, the Q output of each latch is connected to the D input of the next latch in the series. The inverted output (Q') of the last delay latch 100(16) is connected to the D input of the first latch 100(1). Because the Q' output of latch 1000(16) is back-coupled to the D input of the first latch 100(1), frequency divider 90 has a Johnson counter configuration. Additionally, each latch 100(1)-100(16) is also clocked at its L input with one of the 8 input clocks 110(1)-110(8). Each of the latches 100(1)-100(16) generates two output clocks, one at each respective Q output and one at each respective Q' output. Table 4, below, lists the input clocks and output clocks of each latch in frequency divider 90. For ease of reference, the latches are listed in Table 4 in the same sequence in which they are serially arranged in the frequency divider 90.

| Latch | D Input | L Input | Q Output | Q' Output |
|---|---|---|---|---|
| First Latch 100(1) | $C_{4\_348.75}$ | $C_{1\_0}$ | $C_{4\_0}$ | $C_{4\_180}$ |
| Delay Latch 100(5) | $C_{4\_0}$ | $C_{1\_45}$ | $C_{4\_11.25}$ | $C_{4\_191.25}$ |
| Delay Latch 100(6) | $C_{4\_11.25}$ | $C_{1\_90}$ | $C_{4\_22.5}$ | $C_{4\_202.5}$ |
| Delay Latch 100(7) | $C_{4\_22.5}$ | $C_{1\_135}$ | $C_{4\_33.75}$ | $C_{4\_213.75}$ |
| Second Latch 100(2) | $C_{4\_33.75}$ | $C_{1\_180}$ | $C_{4\_45}$ | $C_{4\_225}$ |
| Delay Latch 100(8) | $C_{4\_45}$ | $C_{1\_225}$ | $C_{4\_56.25}$ | $C_{4\_236.25}$ |
| Delay Latch 100(9) | $C_{4\_56.25}$ | $C_{1\_270}$ | $C_{4\_67.5}$ | $C_{4\_247.5}$ |
| Delay Latch 100(10) | $C_{4\_67.5}$ | $C_{1\_315}$ | $C_{4\_78.75}$ | $C_{4\_258.75}$ |
| Third Latch 100(3) | $C_{4\_78.75}$ | $C_{1\_0}$ | $C_{4\_90}$ | $C_{4\_270}$ |
| Delay Latch 100(11) | $C_{4\_90}$ | $C_{1\_45}$ | $C_{4\_101.25}$ | $C_{4\_281.25}$ |
| Delay Latch 100(12) | $C_{4\_101.25}$ | $C_{1\_90}$ | $C_{4\_112.5}$ | $C_{4\_292.5}$ |
| Delay Latch 100(13) | $C_{4\_112.5}$ | $C_{1\_135}$ | $C_{4\_123.75}$ | $C_{4\_303.75}$ |
| Fourth Latch 100(4) | $C_{4\_123.75}$ | $C_{1\_180}$ | $C_{4\_135}$ | $C_{4\_315}$ |
| Delay Latch 100(14) | $C_{4\_135}$ | $C_{1\_225}$ | $C_{4\_146.25}$ | $C_{4\_326.25}$ |
| Delay Latch 100(15) | $C_{4\_146.25}$ | $C_{1\_270}$ | $C_{4\_157.5}$ | $C_{4\_337.5}$ |
| Delay Latch 100(16) | $C_{4\_157.5}$ | $C_{1\_315}$ | $C_{4\_168.75}$ | $C_{4\_348.75}$ |

In the example of FIG. 3, the input clock rate of the initial clock has been chosen such that additional delay(s) (via delay latches 100(5)-100(16)) may be inserted between flip-flops, or between latches, as long as the sum of times and delays is small enough to not violate the timing requirement, as described above (e.g., if the phase difference between two succeeding latches is p degrees, then the sum of hold time, propagation delay, setup time and input clock phase inaccuracies may not exceed $t_4*p/360$). As noted above, although frequency divider 90 includes sixteen latches, the circuit logically is still a two flip-flop Johnson counter, as long as the setup and hold time requirements are met.

The frequency divider 90 of FIG. 3 is referred to herein as a 4:1 frequency divider because it divides the input clocks by a factor of four (i.e., the circuit has a divider ratio of 4). However, this frequency divider 90 is also a multi-phase frequency divider because it generates thirty-two (32) different signals having the divided frequency, but each having different staggered phases. The phases are staggered in that they each have a phase shift from the phase of the base input clock.

Figure 4:
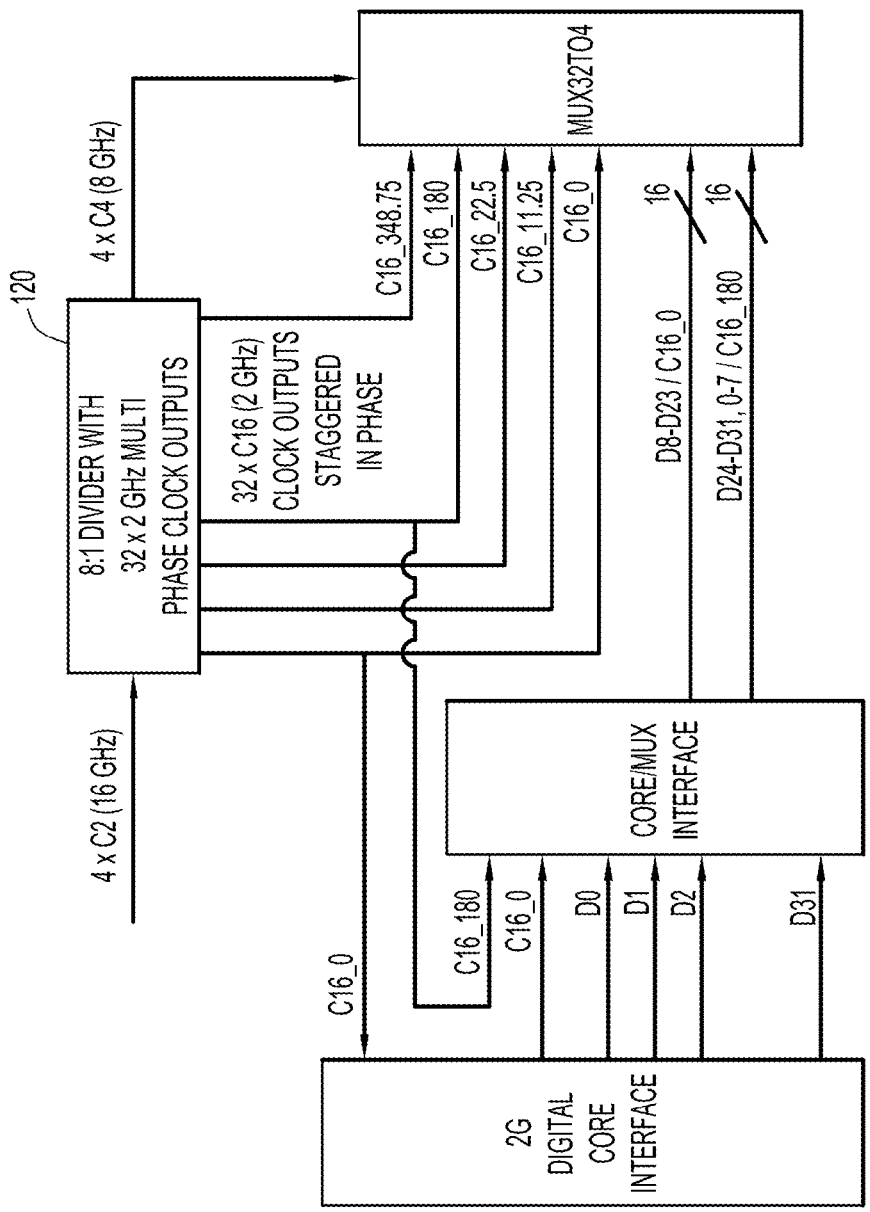
FIG. 4 is a schematic diagram illustrating an application specific integrated circuit (ASIC) that includes the frequency divider of FIG. 3.

In certain examples, the frequency divider 90 may be used in combination with one or more previous frequency dividers. In such examples, the frequency dividers are collectively referred to herein as a multi-stage frequency divider, where one stage generates input clocks for use by the subsequent stage. FIG. 4 is a schematic diagram illustrating one example use of an 8:1 multi-stage frequency divider 120 including as a second stage the frequency divider 90 of FIG. 3. The multi-stage frequency divider 120 is shown in an Application Specific Integrated Circuit (ASIC). More specifically, FIG. 4 illustrates a 32-bit data bus being first clocked with a 2 GHz clock ($C_{16\_0}$), a 2 GHz clock ($C_{16\_180}$), and a 32-phase clock system ($C_{16\_0}$ through $C_{16\_348.75}$).

Figure 5:
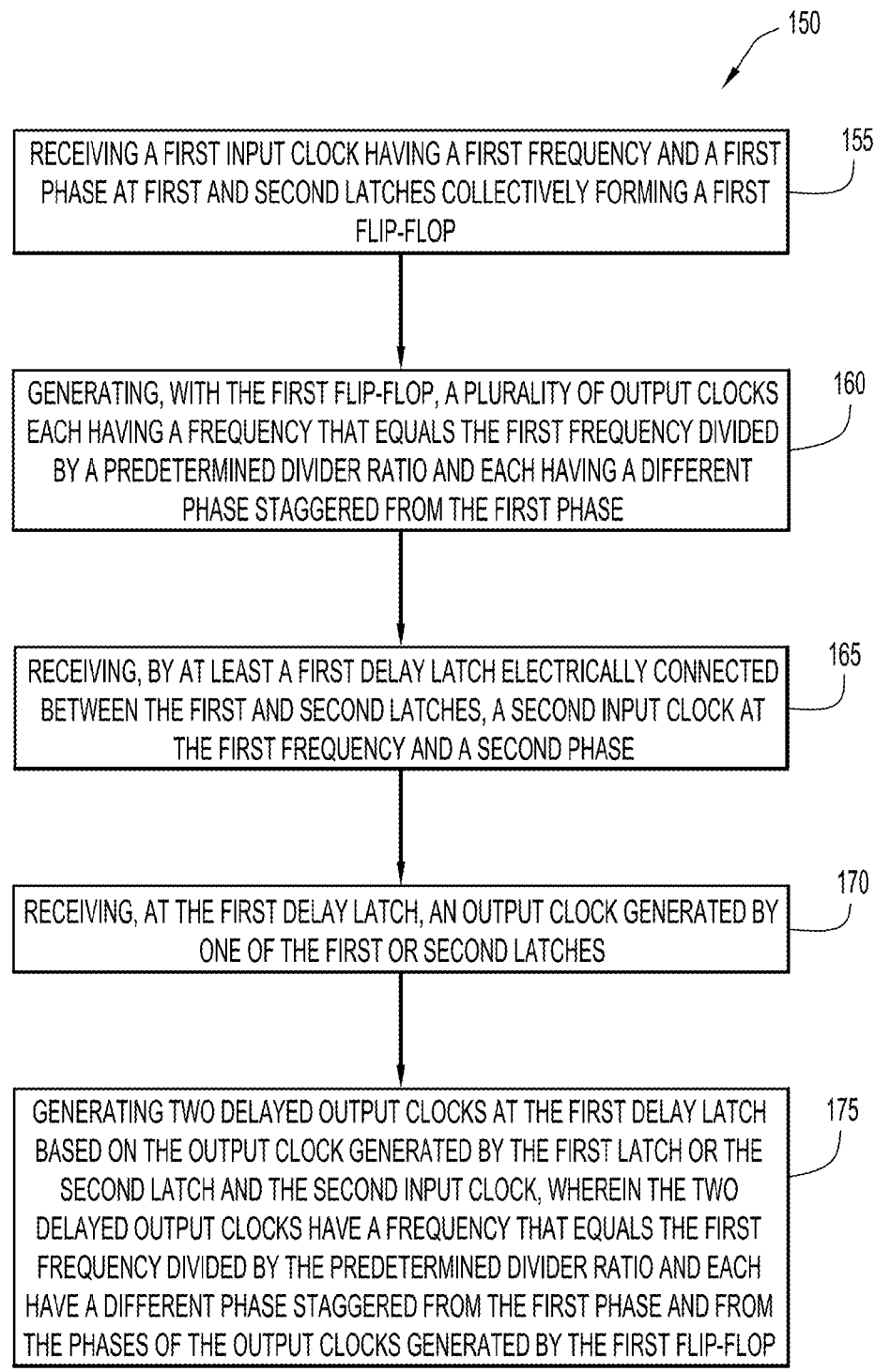
FIG. 5 is a flowchart illustrating a method executed by a multi-phase frequency divider in accordance with examples described herein.

FIG. 5 is a flowchart illustrating a method 150 executed in accordance with examples described herein. First, at 155, a first input clock having a first frequency and a first phase is received at first and second latches that collectively form a first flip-flop. At 160, a plurality of output clocks are generated by the first and second latches. The plurality of output clocks each have a frequency that equals the first frequency divided by a predetermined divider ratio and each having a different phase staggered from the first phase.

Next, at 165, at least a first delay latch receives a second input clock. The second input is at the first frequency (i.e., has the same frequency as the first input clock), but also has a second (different) phase. At 170, the first delay latch receives an output clock generated by the first latch or the second latch. Finally, at 170, two delayed output clocks are generated by the first delay latch based on the output clock generated by the first or the second latch and the second input clock. The two delayed output clocks have a frequency that equals the first frequency divided by the predetermined divider ratio and each have a different phase staggered from the first phase and from the phases of the output clocks generated by the first flip-flop.

A method in accordance with examples described herein comprises receiving a plurality of input clocks having a first frequency and individual phases at a plurality of latches that collectively form a feedback loop having a predetermined divider ratio. The number of latches in the loop is greater than the predetermined divider ratio multiplied by two. This method further comprises generating, with the data outputs and inverted data outputs of the latches, a plurality of output clocks each having a frequency that equals the first frequency divided by the predetermined divider ratio and each having a different phase. In certain examples, the predetermined divider ratio is two, while in other examples the predetermined divider ratio is four. It would be appreciated that further examples may be implemented with higher divider ratios by cascading multiple dividers with a divider ratio of two or four in the sense that a first divider generates output clocks which a second divider uses as input clocks, etc.

A feature of the multi-phase frequency dividers described herein is that the dividers do not need any additional circuitry (logic), besides the illustrated latches, for initialization or supervision for illegal states because the illustrated circuit arrangements do not have illegal states even though one or more additional latches (delay latches) are added to the circuitry. The elimination of this additional initialization/supervisory circuitry (with respect to conventional arrangements) is extremely useful in cases of high-speed clock dividers because such additional logic increases gate count and power consumption, while simultaneously decreasing operating speed. In addition, control signals, such as reset signals, in conventional arrangements must be synchronized to the counter clock, which requires further additional logic. A further advantage of frequency dividers as proposed herein is that all logic elements are evenly loaded with the inputs of other elements, which results in ideal regularity of output phases.

It is to be appreciated that the examples described herein are not restricted to divider ratios $2^n$. It is possible, by means of logic gates, to reduce the counting interval to smaller divider ratios, with the drawback that the phases of the resulting clocks are not evenly distributed. Also, as only Johnson counters with up to two flip-flops are used, the divider ratio can only be reduced by 25% in case of a 2-flip-flop counter, reducing the number of legal states per counter from 4 to 3.

The above description is intended by way of example only.

What is claimed is:

1. An apparatus comprising:
   at least three serially connected latches comprising a first latch, a second latch, and at least one delay latch collectively forming a frequency divider chain and each latch comprising only a single clock input, only a single data input, a data output, and an inverting data output;
   wherein the data output of each latch is electrically connected to the data input of a next latch in the chain, and the inverting data output of a last latch in the chain is electrically connected to the data input of a first latch in the chain, and each latch receives an input clock having a first frequency and an individual input phase;
   wherein the first and second latches form a first flip-flip and each receive an input clock having a different phase and wherein the at least one delay latch is connected between the first and second latches and receives an input clock having a phase that is different from the phase of the input clocks received by the first and second latches forming the first flip flop,
   wherein a phase difference between the phase of the input clock of one latch with reference to the phase of the input clock of a next latch is larger than zero and does not exceed 180 degrees, and a phase difference between the phase of the input clock of the first latch in the chain with reference to the phase of the input clock of the last latch in the chain is larger than 180 degrees and less than 360 degrees.

2. The apparatus of claim 1, wherein the data outputs and inverting data outputs of each of the latches are usable as a multitude of staggered output clocks at a second frequency that is half of the first frequency.

3. The apparatus of claim 1, wherein the phases of the input clocks received at the first, second, and at least third latches are equally spaced.

4. The apparatus of claim 1, wherein the at least three serially connected latches include five latches comprising the first latch, the second latch, a third latch, a fourth latch and the delay latch collectively forming the frequency divider chain and each comprising a clock input, a data input, a data output, and an inverting data output,
   wherein the third and fourth latches collectively form a second flip flop such that the data output of the second latch is electrically connected to the data input of the third latch in the chain, the inverting data output of the fourth latch is electrically connected to the data input of a first latch in the chain;
   wherein a phase difference between the phase of the input clock of one latch with reference to the phase of the input clock of a next latch is larger than zero and does not exceed 180 degrees, and the phase difference between the phase of the input clock of the first latch in the chain with reference to the phase of the input clock of a last latch in the chain is larger than 540 degrees and less than 720 degrees.

5. The apparatus of claim 4, wherein the data outputs and inverting data outputs of each of the five latches are usable as a multitude of staggered output clocks at a second frequency that is a quarter of the first frequency.

6. The apparatus of claim 4, wherein the phases of the input clocks are equally spaced.

7. An apparatus comprising:
a first latch having only a single clock input configured to receive a first input clock having a first frequency and a first phase;
a second latch having only a single clock input configured to receive a second input clock having the first frequency and a second phase which is offset from the phase of the first input clock by 180 degrees,
wherein the first and second latches each include only a single data input and collectively form a first flip-flop configured to generate a plurality of output clocks each having a frequency that equals the first frequency divided by a predetermined divider ratio and each having a different phase staggered from the first phase; and
at least a first delay latch electrically connected between the first and second latches forming the first flip-flop, wherein the first delay latch has only a single data input and only a single clock input that is configured to receive a third input clock having a third phase that is different from the phase of the first and second input clocks and to generate, based on an output clock generated by one of the first or second latches and the third input clock at the first frequency and the third phase, two delayed output clocks at a frequency that equals the first frequency divided by the predetermined divider ratio and each delayed output clock having a different phase staggered from the first phase and from the phases of the output clocks generated by the first flip-flop.

8. The apparatus of claim 7, wherein an input of a third latch is configured to receive the output clock from one of the first or second latches, and wherein the phase of the third input clock is delayed with reference to the phase of the first or second latch from which the third latch is configured to receive the clock input, and wherein the phase of the third input clock is accelerated with reference to the phase of an input clock of a latch that is configured to receive the output clock from the first delay latch.

9. The apparatus of claim 7, further comprising:
a third latch configured to receive the first input clock at the first frequency and the first phase; and
a fourth latch configured to receive the second input clock having the first frequency and the second phase, wherein the third and fourth latches collectively form a second flip-flop configured to generate a plurality of output clocks having a frequency that equals the first frequency divided by the predetermined divider ratio and each having a different phase staggered from the first phase, from the phases of the output clocks generated by the first flip-flop, and from the phases of the two delayed output clocks.

10. The apparatus of claim 9, wherein the predetermined divider ratio is four.

11. The apparatus of claim 9, wherein an output of the second latch is connected to an input of the third latch, an output of the third latch is connected to an input of the fourth latch, and an output of the fourth latch is connected to an input of the first latch.

12. The apparatus of claim 11, wherein the at least first delay latch comprises a first group of delay latches serially connected between the first and second latches, and further comprising:

a second group of delay latches serially connected between the second and third latches;
a third group of delay latches serially connected between the third and fourth latches; and
a fourth group of delay latches serially connected between the output of the fourth latch and the input of the first latch,
wherein each of the latches in the first, second, third, and fourth groups of latches are configured to receive input clocks that have different phases from the input clocks received by other latches in the same group, and each delay latch is configured to generate two additional delayed output clocks having a frequency that equals the first frequency divided by the predetermined divider ratio and each having a different phase staggered from the first phase, from the phases of the output clocks generated by the first flip-flop, from the phases of the output clocks generated by the second flip-flop, and from the phases from other latches in the first, second, third, and fourth groups of delay latches.

13. The apparatus of claim 12, wherein the first, second, third, and fourth groups of delay latches each comprise three latches such that thirty-two (32) different phases of output clocks are generated.

14. The apparatus of claim 12, wherein the predetermined divider ratio is four.

15. The apparatus of claim 7, further comprising:
a second delay latch configured to generate, based on an output clock generated by the second latch and the second input clock at the first frequency and the second phase, two additional delayed output clocks each having a frequency that equals the first frequency divided by the predetermined divider ratio and each having a different phase from the first phase, the phases of the output clocks generated by the first flip-flop, and the phases of the two delayed output clocks generated by the first delay latch.

16. The apparatus of claim 15, wherein an output of the first latch is connected to an input of the first delay latch, an output of the first delay latch is connected to an input of the second latch, an output of the second latch is connected to an input of the second delay latch, an output of the second delay latch is connected to an input of the first latch.

17. The apparatus of claim 15, wherein the predetermined divider ratio is two.

18. A method comprising:
receiving a first input clock having a first frequency and a first phase at a first latch that includes only a single clock input and only a single data input;
receiving a second input clock having the first frequency and a second phase at a second latch that includes only a single clock input and only a single data input, wherein the first and second latches collectively form a first flip-flop;
generating, with the first flip-flop, a plurality of output clocks each having a frequency that equals the first frequency divided by a predetermined divider ratio and each having a different phase staggered from the first phase; and
receiving, by at least a first delay latch connected between the first and second latches forming the first flip-flop, a third input clock at the first frequency and a third phase that is different from the first phase and the second phase, wherein the first delay latch includes only a single clock input and only a single data input;
receiving, at the first delay latch, an output clock generated by one of the first or second latches, wherein the phases of the first, second, and third input clocks are such that the second latch receive the first input clock with an offset of 180 degrees with respect to the first phase; and generating two delayed output clocks at the first delay latch based on the output clock generated by the first latch or the second latch and the second input clock, wherein the two delayed output clocks have a frequency that equals the first frequency divided by the predetermined divider ratio and each have a different phase staggered from the first phase and from the phases of the output clocks generated by the first flip-flop.

19. The method of claim 18, wherein an input of a third latch is configured to receive the output clock from one of the first or second latches, and wherein the phase of the third input clock is delayed with reference to the phase of the first or second latch from which the third latch is configured to receive the clock input, and wherein the phase of the third input clock is accelerated with reference to the phase of an input clock of a latch that is configured to receive the output clock from the first delay latch.

20. The method of claim 18, wherein generating the plurality of output clocks with the first flip-flop comprises:
generating four output clocks having staggered phases.

21. The method of claim 18, further comprising:
receiving the first input clock at the first frequency and the first phase at third and fourth latches collectively forming a second flip-flop, wherein the phases of the input clocks are such that the fourth latch receives the first input clock with an offset of 180 degrees;
generating, with the second flip-flop, a plurality of output clocks having a frequency that equals the first frequency divided by the predetermined divider ratio and each having a different phase staggered from the first phase, from the phases of the output clocks generated by the first flip-flop, and from the phases of the two delayed output clocks.

22. The method of claim 18, further comprising:
providing an output clock from the fourth latch as an input to the first latch.

23. The method of claim 18, wherein the at least first delay latch comprises a first group of delay latches serially connected between the first and second latches, a second group of delay latches serially connected between the second and third latches, a third group of delay latches serially connected between the third and fourth latches, and a fourth group of delay latches serially connected to the output of the fourth latch, the method further comprising:
receiving, at each of the latches in the first, second, third, and fourth groups of latches, input clocks that have different phases from the input clocks received by other latches in the same group wherein the phase of any input clock is delayed with reference to the phase of the input clock of the latch that feeds its clock output to the latch receiving the input clock, and wherein the phase of an input clock to a selected latch is accelerated with reference to the phase of a subsequent latch that is receiving the output clock from the selected latch; and
generating, at each delay latch, two additional delayed output clocks having a frequency that equals the first frequency divided by the predetermined divider ratio and each having a different phase staggered from the first phase, from the phases of the output clocks generated by the first flip-flop, from the phases of the output clocks generated by the second flip-flop, and from the phases from other latches in the first, second, third, and fourth groups of delay latches.

24. The method of claim 18, further comprising:
receiving, by a second delay latch electrically connected between the second and first latches, the second input clock at the first frequency and the second phase;
receiving an output clock generated by the second latch; and
generating two additional delayed output clocks at the second delay latch based on the output clock generated by the second latch and the second input clock, wherein the two additional delayed output clocks each have a frequency that equals the first frequency divided by the predetermined divider ratio and each having a different phase from the first phase, the phases of the output clocks generated by the first flip-flop, and the phases of the two delayed output clocks generated by the first delay latch.

* * * * *